United States Patent [19]
Oppermann

[11] Patent Number: 5,994,751
[45] Date of Patent: Nov. 30, 1999

[54] PHOTODIODE HAVING REDUCED SERIES RESISTANCE, AND METHOD FOR FABRICATION THEREOF

[75] Inventor: Klaus-Günter Oppermann, Holzkirchen, Germany

[73] Assignee: Siemens Aktiengesellschaft, Munich, Germany

[21] Appl. No.: 09/000,380

[22] PCT Filed: Jul. 5, 1996

[86] PCT No.: PCT/DE96/01210

§ 371 Date: Jan. 29, 1998

§ 102(e) Date: Jan. 29, 1998

[87] PCT Pub. No.: WO97/06566

PCT Pub. Date: Feb. 20, 1997

[30] Foreign Application Priority Data

Aug. 3, 1995 [DE] Germany ............... 195 28 573

[51] Int. Cl.⁶ .................................. H01L 31/00
[52] U.S. Cl. ............... 257/446; 257/461; 257/466; 257/594
[58] Field of Search .................. 257/446, 461, 257/466, 594, 510, 513, 514, 515

[56] References Cited

U.S. PATENT DOCUMENTS

| 4,157,926 | 6/1979 | Schoolar | 148/175 |
| 4,733,286 | 3/1988 | Matsumoto | 257/466 |
| 5,360,987 | 11/1994 | Shibib | 257/466 |

FOREIGN PATENT DOCUMENTS

0 061 803  10/1982  European Pat. Off. .

OTHER PUBLICATIONS

Appl. Phys. Lett. 37(11), Dec. 1, 1980—A High–speed Si Lateral Photodetector Fabricated over and Etched Interdigital Mesa, pp. 1014–1016, Chen et al.

IEEE Transactions on Electron Devices, vol. Ed–26, No. 7, Jul. 1979 pp. 1091–1097, "The V–Groove Multijunction Solar Cell", Chappell.

*Primary Examiner*—Minh Loan Tran
*Attorney, Agent, or Firm*—Hill & Simpson

[57] ABSTRACT

In an SOI substrate, an active zone is completely surrounded by a trench filled with insulating material. Disposed adjacent to the trench is a first doped zone which is formed, in particular, by out-diffusion from a doped layer disposed on the wall of the trench. The first doped zone and a second doped zone form a p-n junction of a photodiode.

8 Claims, 1 Drawing Sheet

PHOTODIODE HAVING REDUCED SERIES RESISTANCE, AND METHOD FOR FABRICATION THEREOF

BACKGROUND OF THE INVENTION

1. Field of the Invention

The present invention relates to a photodiode, and a method for its fabrication, which can be fabricated in an integrated circuit and which has a reduced series resistance.

2. Description of the Prior Art

In various integrated circuit arrangements, e.g. in optocouplers and electronic relays, photodiodes are employed as integrated energy and signal sources. For this application, the photodiodes are to have a high off-load voltage, a high short-circuit current and a maximum power output. The power provided by the photodiode does depend on the internal resistance of the photodiode. The internal resistance is formed by the series resistance which results from the sheet resistances of the diffusion zones of the photodiode, the contact resistances of the metallic coatings of the photodiode, and the conduction resistances of the metallic coatings (see, e.g., S. M. Sze, "Physics of Semiconductor Devices", Wiley, New York, Ch. 14.3.2).

Photodiodes which are fabricated as individual components are provided, in order to reduce the series resistance and to increase the photon yield, with back contacts and special geometries to reflect the light; e.g., V trench patterns (see, e.g., S. M. Sze "Physics of Semiconductor Devices", Wiley, New York, Ch. 14.3.4).

Photodiodes which are fabricated in a state integrated in a substrate cannot be provided with back contacts or reflection patterns. Photodiodes which are integrated in a substrate have a p-n junction near the top of the component, which separates the electrons and holes generated in the silicon by photons. The p-doped and n-doped zones are electrically connected in this arrangement via narrow, highly doped n-doped and p-doped strips, respectively. The highly doped strips have a high internal resistance. The sheet resistance of the conduction is reduced by means of a metallization layer which has contacts over the entire length of the highly doped strips. At the same time, part of the photosensitive area of the photodiode is covered, so that the photon yield is reduced.

SUMMARY OF THE INVENTION

The photodiode according to the present invention is integrated in a substrate and is insulated with respect to the substrate by dielectric insulation. To this end, the substrate includes a carrier chip, an insulating layer disposed thereon, and a monocrystalline silicon layer disposed on the insulating layer thereon. Provisions are made, in the monocrystalline silicon layer, for a trench which extends from a principal face of the silicon layer to as far as the insulating layer. The trench is filled, e.g., with $SiO_2$ or is lined with $SiO_2$ and filled with polysilicon. The trench completely surrounds an active zone in the silicon layer. Downwards, the active zone is insulated from the carrier chip by the insulating layer.

In the active zone, a first doped zone is provided for which directly adjoins the trench. The first doped zone extends from the principal face of the silicon layer to as far as the insulating layer. The first doped zone is doped to a first conductivity type, e.g., p-doped. Preferably, the first doped zone, at the interface with the trench, has a dopant concentration in the range between $10^{18}$ cm$^{-3}$ and $10^{20}$ cm$^{-3}$ in conjunction with a penetration depth of e.g. 3 μm.

Also provided for in the active zone is a second doped zone which is doped to a second conductivity type opposite to the first, e.g., n-doped. The second doped zone, together with the first doped zone, forms a p-n junction which constitutes the photodiode.

Disposed on the principal face of the silicon layer are contacts for both the first doped zone and the second doped zone. With a view to as low a connection resistance as possible, these contacts are preferably located on connection zones of elevated dopant concentration.

Since the first doped zone extends from the principal face to as far as the insulating layer, the area of the p-n junction effective for the photodiode is enlarged with respect to the area required on the principal face for the photodiode. Furthermore, the maximally required diffusion path of the charge carriers, produced by incident photons, to the next p-n junction is reduced. Finally, the first doped zone constitutes a low-resistance path for the charge carriers. Beyond the contacts to the doped zones no provision is made on the principal face for any coverage by metal contacts or metal conductor tracks. This means that virtually the entire surface area of the active zone is available for the incidence of light.

Preferably, the trench is filled with $SiO_2$. Since $SiO_2$ has a smaller refractive index than silicon, light which has entered the insulating material in the trench is able to penetrate into the optically denser silicon and contribute to charge carrier generation. The critical angle for total reflection of silicon/$SiO_2$ is 23°. Consequently, there is virtually no refraction from the silicon into the $SiO_2$.

A further improvement of the photodiode is achieved as a result of disposing in the active zone at least one further trench which extends from the principal face to as far as the insulating layer and is filled with insulating material. Provisions are further made, in the active zone, for a third doped zone which is doped to the first conductivity type, e.g., p-doped, and directly adjoins the further trench. The third doped zone extends from the principal face of the silicon layer to as far as the insulating layer. The third doped zone causes a further enlargement of the area of the p-n junction. Moreover, it is thus possible to reduce the maximally required diffusion path. The number of further trenches can be chosen almost at will. An upper limit is set only by the process; that is to say, for example, by trench width, diffusion depth of the third doped zones, photolithography or the like.

Advantageously, provision are made for the trench(es) to have oblique sidewalls since the refraction of light from the trench consisting of $SiO_2$ into the active zone consisting of silicon is further improved.

Preferably, the first doped zone and the third doped zone are produced by out-diffusion from a dopant source situated in the trench. To this end, trench etching is followed by generation of a doped layer which covers at least the sidewalls of the trench. Suitable doped layers include, e.g., doped glass or doped polycrystalline or amorphous silicon. The first doped zone and the third doped zone are produced by out-diffusion from the doped layer in an annealing step.

If a doped silicon layer is employed as the dopant source, it is within the scope of the invention that the annealing step be conducted in such a way that, at the same time as the out-diffusion of the dopant, further oxidation takes place of the doped silicon layer, in the course of which the trench is filled with $SiO_2$.

The photodiode according to the present invention is completely dielectrically insulated from the substrate by the surrounding trench and the insulating layer. Consequently, the substrate may include, next to one another, a multiplicity of photodiodes which are completely independent of one another electrically. If these photodiodes are arranged in a series connection, the output voltage of the series connection corresponds to the sum of the individual voltages of the individual photodiodes. Thus, the photodiode according to the present invention is suitable for providing, in a series connection with a multiplicity of photodiodes, the voltage required for driving a high-voltage MOSFET. In this case, there are no leakage current problems to the substrate. Moreover, the space required for the insulation in the insulation-filled trench is minimal.

Additional features and advantages of the present invention are described in, and will be apparent from, the Detailed Description of the Presently Preferred Embodiments and from the Drawings.

DETAILED DESCRIPTION OF THE PREFERRED EMBODIMENTS

Figure 1:
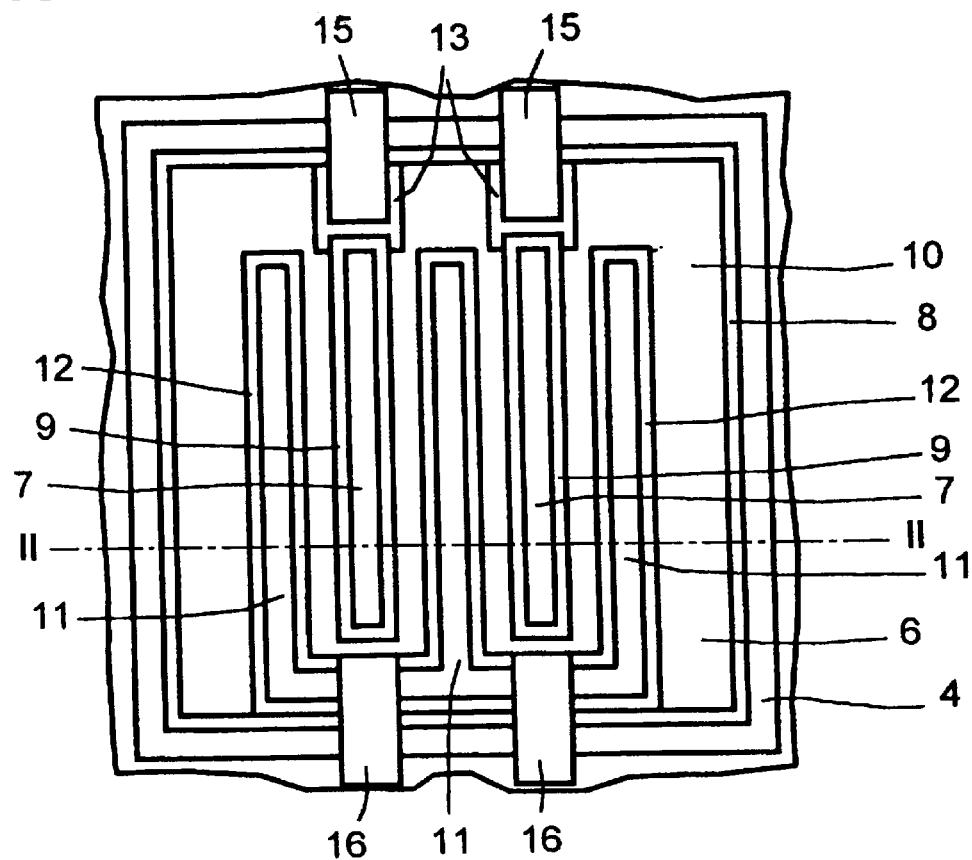
FIG. 1 shows a plan view of an embodiment of a photodiode of the present invention having two trenches in an active zone.
Figure 2:
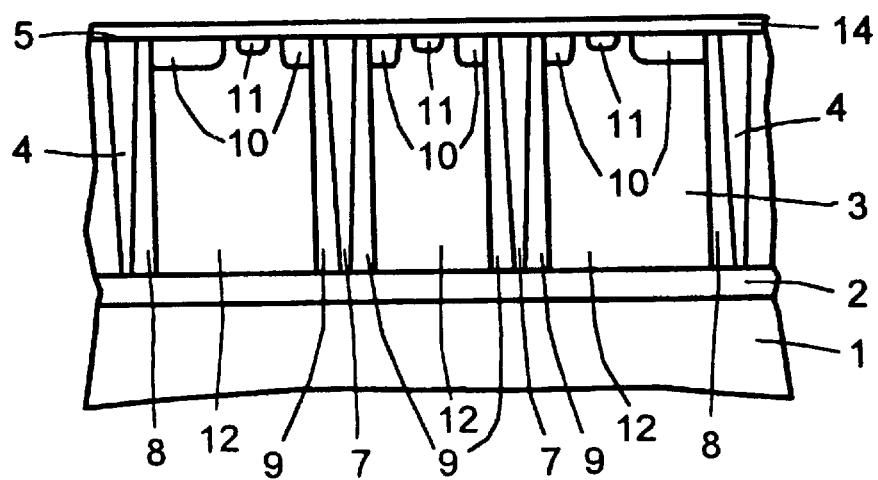
FIG. 2 shows a cross-sectional view of the photodiode from FIG. 1 taken along lines II—II.

Referring to FIGS. 1 and 2, an SOI substrate is shown which includes a silicon chip 1 on which an insulating layer 2 and a monocrystalline silicon layer 3 are disposed (see FIG. 2). The insulating layer 2 consists of, e.g., $SiO_2$ and has a thickness of, e.g., 1 $\mu$m. The monocrystalline silicon layer 3 has a thickness of, e.g., 20 $\mu$m and is, e.g., n-doped with a dopant concentration of $6 \times 10^{14}$ $cm^{-3}$.

Disposed in the monocrystalline silicon layer 3 is a trench 4 which extends from a principal face 5 of the monocrystalline silicon layer to as far as the insulating layer 2 (see FIG. 1 and FIG. 2). The trench 4 completely encloses an active zone 6. The trench 4 is filled with insulating material, e.g., $SiO_2$. The trench 4 has a width of, e.g., 3 $\mu$m. The active zone 6 enclosed by the trench 4 has dimensions of, e.g., 200 $\mu$m×200 $\mu$m.

Two further trenches 7 are disposed in the active zone 6 and each extend from the principal face 5 to as far as the insulating layer 2. The further trenches 7 are strip-shaped and do not communicate with trench 4. The further trenches 7 are likewise filled with insulating material, e.g., $SiO_2$.

In the active zone 6, a first doped zone 8 is disposed adjacent to trench 4. The first doped zone 8 is, e.g., $p^+$-doped and at the interface to trench 4 has a dopant concentration of, e.g., $10^{19}$ $cm^{-3}$. The penetration depth is, e.g., 3 $\mu$m. The first doped zone 8 extends from the principal face 5 to as far as the insulating layer 2, the first doped zone 8 directly adjoining the trench 4. The first doped zone 8 surrounds the active zone 6 annularly.

Provisions are further made, in the active zone 6, for two third doped zones 9 which are each disposed adjacent to one of the further trenches 7, the third doped zone 9 in each case surrounding the further trench 7 annularly. The third doped zones 9 extend from the principal face 5 to as far an the insulating layer 6. The third doped zones 9 are, e.g., $p^+$-doped and at the interface to the respective further trench 7 have a dopant concentration in the range of from $10^{18}$ $cm^{-3}$ to $10^{20}$ $cm^{-3}$.

Also disposed on the principal face 5 are p-doped troughs 10 which each adjoin the trench 4 or one of the further trenches 7. The p-doped troughs 10 have a dopant concentration in the range between $10^{16}$ $cm^{-3}$ and $10^{19}$ $cm^{-3}$ and a depth of, e.g., 2 $\mu$m.

Disposed on the principal face 5 is an $n^+$-doped connection zone 11 which is completely surrounded by a second doped zone 12 which is formed from the base material of the n-doped monocrystalline layer 3. The $n^+$-doped connection zone 11 comprises a plurality of strip-shaped elements which are each disposed between the further trenches 7 or between one of the further trenches 7 and the trench 4 and which are connected to one another by a further strip-shaped connection element disposed perpendicularly thereto.

Also disposed on the principal face 5 are $p^+$-doped connection zones 13 which are each disposed at the edge of the active zone 6 and which each partially overlap one of the third doped zones 9 and the first doped zone 8. The $p^+$-doped connection zones 13 constitute an electrical connection between the first doped zone 8 and the respective third doped zone 9. The $p^+$-doped connection zones 13 have a dopant concentration of, e.g., $10^{19}$ $cm^{-3}$.

The $n^+$-doped connection zones 11 and the $p^+$-doped connection zones 13 each have a depth of approximately 0.8 $\mu$m.

The active zone 6 at least is provided, on the principal face 5, with a passivation layer 14. The passivation layer 14 is tailored, in terms of thickness and material, to the wavelength of the light to be detected so that the passivation layer 14 is transparent for the latter. Suitable as a passivation layer is, in particular, $SiO_2$ or $Si_3N_4$. The passivation layer 14 has a thickness of, e.g., 1 $\mu$m.

Above the $p^+$-doped connection zones 13, contacts 15 made of, e.g., aluminium are disposed on the passivation layer 14 and are connected, via a contact hole in the passivation layer 14, to the respective $p^+$-doped connection zone. At or near the strip-shaped connection element of the $n^+$-doped connection zone 11, for example, two contacts 16 made of, e.g., aluminium are disposed and are each connected, via contact holes, to the n+-doped connection zone 11. Preferably, the contacts 15 to the $p^+$-doped connection zones and the contacts 16 to the $n^+$-doped connection zone 11 are disposed symmetrically, since this has an advantageous effect on the current distribution in the photodiode.

The second doped zone 12 is formed from the base material of the monocrystalline silicon layer 3 and forms, together with the adjacent first doped zone 8 and third doped zones 9 and the p-doped troughs 10, a p-n junction which forms the photodiode. The $p^+$-type doping in the first doped zone 8 and the third doped zones 9 in this arrangement ensures good conductivity. The p-type doping of the p-doped troughs 10 ensures a band gap which is modified only slightly in the surface region, and consequently ensures only slightly modified absorption characteristics of the silicon.

For the purpose of fabricating the photodiode according to the present invention, a mask is first formed by photolithographic process steps, followed by the formation, in the monocrystalline silicon layer 3, of the trench 4 and the further trenches 7 by anisotropic etching, e.g. with HBr, He, $O_2$. Via the parameters involved in anisotropic etching, the sidewalls of the trenches 4, 7 are formed so as to be perpendicular or oblique to the principal face. Then a doped layer, e.g. of borosilicate glass or $p^+$-doped silicon, is deposited, which covers at least the sidewalls of the trenches 4, 7. In an annealing step at, e.g., 1000° C. the first doped zone 8 and the third doped zones 9 are formed by out-diffusion of the dopant from the doped layer into the sidewalls of the trench 4 and the further trenches 7. Then the trench 4 and the further trenches 7 are filled up with insulating material. This takes place, e.g. after removal of the doped layer in an etching step, by the deposition of an SiO$_2$ layer. Portions of the SiO$_2$ layer which are located on or near the principal face 5 are removed by planarizing etching steps.

If the doped layer consists of doped silicon, the annealing step can be carried out in such a way that in the course of the out-diffusion of the dopant to form the first doped zone 8 and the third doped zones 9, the doped layer is oxidized further and the trench 4 and the further trenches 7 are thus filled up with SiO$_2$.

The p-doped trough 10, the n$^+$-doped connection zone and the p$^+$-doped connection zones 13 are then formed by masked implantation.

After deposition of the passivation layer 14, contact holes to the n$^+$-doped connection zone 11 and the p$^+$-doped connection zone 13 are opened in a known manner. The contacts 15, 16 are finally finished by the deposition of a metallization layer, e.g., of aluminium, and patterning of the metallization layer.

Although the present invention has been described with reference to specific embodiments, those of skill in the art will recognize that changes may be made thereto without departing from the spirit and scope of the invention as set forth in the hereafter appended claims.

I claim:

1. A photodiode, comprising:

a carrier chip;

an insulating layer disposed on the carrier chip;

a monocrystalline silicon layer disposed on the insulating layer and having an upper surface defined as a principal face of the silicon layer, the silicon layer including a first trench extending between the insulating layer and the principal face and filled with an insulating material, the silicon layer also including an active zone completely surrounded by the first trench, the active zone having a first conductivity-type first doped zone directly adjoining the first trench and extending between the insulating layer and the principal face, the first doped zone having a dopant concentration in the range of 10$^{18}$ cm$^{-3}$ to 10$^{20}$ cm$^{-3}$, the active zone further having a second conductivity-type second doped zone which forms a p-n junction with the first doped zone;

a second trench in the active zone extending between the insulating layer and the principal face and filled with an insulating material;

a first conductivity-type third doped zone in the active zone directly adjoining the second trench, the third doped zone extending between the insulating layer and the principal face;

a first contact on the principal face connected to the first doped zone; and a second contact on the principal face connected to the second doped zone.

2. A photodiode as claimed in claim 1, wherein the second doped zone extends between the insulating layer and the principal face.

3. A photodiode as claimed in claim 1, further comprising:

at least one trough in the active zone which is doped to the first conductivity-type, the at least one trough adjoining the principal face and having a trough contact.

4. A photodiode as claimed in claim 1, wherein one of the first and second trenches has oblique side walls such that a cross-section of the trench near the principal face is larger than a cross-section of the trench near the insulating layer.

5. A method of fabricating a photodiode, comprising the steps of:

providing a carrier chip;

disposing an insulating layer on the carrier chip;

disposing a monocrystalline silicon layer on the insulating layer, the silicon layer having an upper surface defined as a principal face of the silicon layer;

forming a first trench in the silicon layer, the first trench extending between the insulating layer and the principal face;

filling the first trench with an insulating material;

establishing an active zone in the silicon layer which is completely surrounded by the first trench;

forming a first conductivity-type first doped zone in the active zone which directly adjoins the first trench and which extends between the insulating layer and the principal face, the first doped zone having a dopant concentration in the range of 10$^{18}$ cm$^{-3}$ to 10$^{20}$ cm$^{-3}$;

forming a second conductivity-type second doped zone in the active zone, the second doped zone forming a p-n junction with the first doped zone;

forming a second trench in the active zone extending between the insulating layer and the principal face;

filling the second trench with an insulating layer;

forming a first conductivity-type third doped zone in the active zone directly adjoining the second trench, the third doped zone extending between the insulating layer and the principal face;

providing a first contact on the principal face connected to the first doped zone; and providing a second contact on the principal face connected to the second doped zone.

6. A method of fabricating a photodiode as claimed in claim 5, wherein the second doped zone extends between the insulating layer and the principal face.

7. A method of fabricating a photodiode as claimed in claim 5, further comprising the step of:

forming a doped layer in the active zone which is doped to the first conductivity-type and which covers sidewalls of the first trench; and forming the first doped zone through out-diffusion from the doped layer.

8. A method of fabricating a photodiode as claimed in claim 5, wherein one of the first and second trenches has oblique side walls such that a cross-section of the trench near the principal face is larger than a cross-section of the trench near the insulating layer.

* * * * *